US012755064B2

(12) United States Patent
Chandra Mohan et al.

(10) Patent No.: US 12,755,064 B2
(45) Date of Patent: Oct. 6, 2026

(54) AUTOMATIC MACHINE LEARNING BASED PREDICTION OF BASELINE ENERGY CONSUMPTION

(71) Applicant: Honeywell International Inc., Charlotte, NC (US)

(72) Inventors: Ananda Vel Murugan Chandra Mohan, Madurai (IN); Banuprakash Balakrishna, Udupi (IN); Chhavi Chawla, Jaipur (IN); Deepika Sandeep, Bangalore (IN); Rohil Pal, Kanpur (IN); Surjayan Ghosh, Kolkata (IN); Swaroop Reddy Konala, Telangana (IN)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 1168 days.

(21) Appl. No.: 17/827,230

(22) Filed: May 27, 2022

(65) Prior Publication Data

US 2023/0385469 A1 Nov. 30, 2023

(51) Int. Cl.

| | |
|---|---|
| ***G06F 30/13*** | (2020.01) |
| ***G06F 30/27*** | (2020.01) |
| ***G06Q 10/04*** | (2023.01) |

(52) U.S. Cl.

CPC .............. *G06F 30/13* (2020.01); *G06F 30/27* (2020.01)

(58) Field of Classification Search

CPC ......... G06F 30/13; G06F 30/27; G05B 15/02; G06N 5/01; G06N 20/20; G06Q 50/06; G06Q 10/04

See application file for complete search history.

(56) References Cited

U.S. PATENT DOCUMENTS

| | | | |
|---|---|---|---|
| 7,881,889 | B2 | 2/2011 | Barclay et al. |
| 9,569,804 | B2 | 2/2017 | Stein et al. |

(Continued)

FOREIGN PATENT DOCUMENTS

| | | | |
|---|---|---|---|
| WO | 2009039500 | A1 | 3/2009 |
| WO | 2018218334 | A1 | 12/2018 |
| WO | 2019217323 | A1 | 11/2019 |

OTHER PUBLICATIONS

Extended European Search Report, European Patent Office, EP Application No. 23175711.3, Sep. 18, 2023 (12 pgs).

(Continued)

*Primary Examiner* — Brian W Wathen

(74) *Attorney, Agent, or Firm* — Seager, Tufte & Wickhem, LLP

(57) ABSTRACT

The present solution, approach or method, including an end-to-end automated data pipeline for data ingestion, storage, analysis, deployment, and a machine learning model maintenance. The present solution, approach or method, which computes a baseline using machine learning methods, may help in the following ways. Accurate real time estimation may help evaluate the deviation in the actual energy consumption, effectively identifying underlying root causes for an increase in actual consumption, as compared to the estimated energy. Triangulating the time of day and place of high energy consumption results in quicker resolution. Accurately quantifying energy savings may be helpful. Forecasting energy consumption in the future, may enable planning for future energy needs. Energy saving calculations may be done by comparing actual consumption versus baseline predicted consumption based for a specific baseline period. This solution may offer a configurable machine learning model, which takes on energy consumption patterns.

4 Claims, 19 Drawing Sheets

(56) References Cited

U.S. PATENT DOCUMENTS

| | | | | |
|---|---|---|---|---|
| 10,055,114 | B2 | 8/2018 | Shah et al. | |
| 11,544,622 | B2 | 1/2023 | Cella | |
| 2009/0187445 | A1* | 7/2009 | Barclay | G06Q 50/06 702/60 |
| 2011/0246381 | A1* | 10/2011 | Fitch | G06Q 50/06 703/2 |
| 2013/0036128 | A1* | 2/2013 | Ben-Tsion | G06F 13/00 707/756 |
| 2015/0316907 | A1* | 11/2015 | Elbsat | G05B 19/418 |
| 2016/0110736 | A1* | 4/2016 | Sloss | G06Q 30/04 705/7.31 |
| 2016/0305678 | A1* | 10/2016 | Pavlovski | G05B 15/02 |
| 2019/0205774 | A1* | 7/2019 | Ba | G06N 20/20 |
| 2020/0348641 | A1* | 11/2020 | Li | G06N 20/00 |
| 2020/0379423 | A1* | 12/2020 | Wenzel | G06Q 50/163 |
| 2021/0097565 | A1* | 4/2021 | Subbloie | G06Q 10/06315 |
| 2021/0125253 | A1* | 4/2021 | Vega | H04L 67/12 |
| 2021/0191341 | A1* | 6/2021 | Subbloie | H02H 7/20 |
| 2021/0373753 | A1* | 12/2021 | Park | G06F 3/04847 |
| 2022/0121160 | A1* | 4/2022 | Subbloie | H02H 1/0007 |

OTHER PUBLICATIONS

Mustapa et al., "Energy consumption prediction through linear and non-linear baseline energy model", vol. 17, No. 1, pp. 102-109, Jan. 2020.

Novelty Search Report, IDF-226505, pp. 1-15, Feb. 2022.

Touzani et al., "Gradiant boosting machine for modeling the energy consumption of commercial buildings", pp. 1-26, 2018.

* cited by examiner

51

| Site 1 | Model - XGB | Remarks |
| --- | --- | --- |
| Independent Variables | 53 - Temperature<br>- Heating degree days<br>- Cooling degree days<br>- DewPoint<br>- Humidity<br>- Weekend<br>- timeOfDay<br>- timeOfDay engineered | |
| Co-efficient of Determination (R2): Measure of % variance in meter reading explained by model | 0.68 | Higher the score better the model |
| SMAPE: | 0.074 | Lower the score better the model |
| CvRMSE: | 0.11 | Lower the score better the model |
| RMSE: | 17.85 | Lower the score better the model |
| NMBE: | -0.0039 | Lower the score better the model |

FIGURE 4

Site 1 Consumption Data

61

| Site 2 | Model - XGB | Remarks |
|---|---|---|
| Independent Variables | 63 - Temperature<br>- Heating degree days<br>- Cooling degree days<br>- DewPoint<br>- Humidity<br>- Weekend<br>- timeOfDay<br>- timeOfDay engineered | |
| Co-efficient of Determination (R2): Measure of % variance in meter reading explained by model | 0.55 | Higher the score better the model |
| SMAPE: | 0.27 | Lower the score better the model |
| CvRMSE: | 0.40 | Lower the score better the model |
| RMSE: | 35.08 | Lower the score better the model |
| NMBE: | -0.0164 | Lower the score better the model |

FIGURE 6

Site 2 Consumption Data $$\text{error} = \frac{1}{N}\sum_{i=1}^{N}\frac{\text{pred}_i - \text{actual}_i}{\text{actual}_i}$$

Sample

Graph Representation

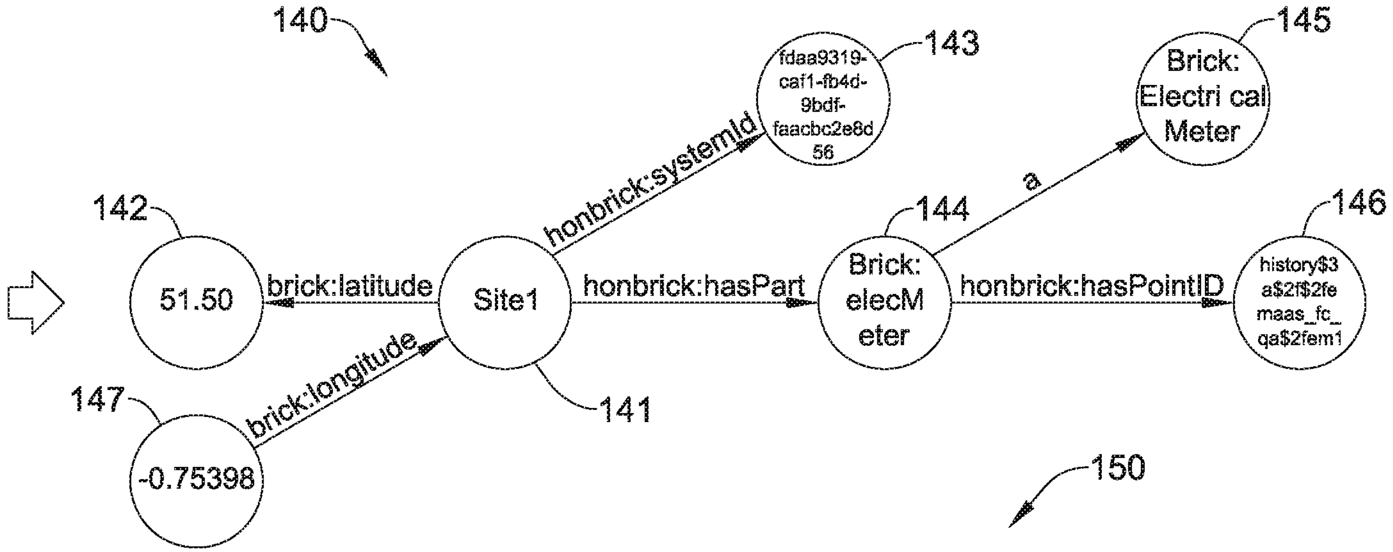

| | insertTime | contextId | subject | predicate | object |
|---|---|---|---|---|---|
| 1 | 2021-11-10T14:21:05.221+0000 | enactoTest | Site1 | honbrick:systemId | fdaa9319-caf1-4b4d-9bdf-faacbc2e8d56 |
| 2 | 2021-11-10T14:21:05.221+0000 | enactoTest | Site1 | brick:latitude | 51.41604 |
| 3 | 2021-11-10T14:21:05.221+0000 | enactoTest | Site1 | brick:longitude | -0.75398 |
| 4 | 2021-11-10T14:21:05.221+0000 | enactoTest | consumption | honbrick:pointId | history$3a$2f$2femaas_fc_qa$2fem1 |
| 5 | 2021-11-10T14:21:05.221+0000 | enactoTest | Site1 | brick:hasPart | electMeter |
| 6 | 2021-11-10T14:21:05.221+0000 | enactoTest | electMeter | a | brick:Building Electrical Meter |
| 7 | 2021-11-10T14:21:05.221+0000 | enactoTest | electMeter | brick:hasPoint | consumption |

How it is stored in Delta Tables

FIGURE 15

Sample Delta Tables

Weather data stream from weather API (Bronze 2)

169

| FacilityId | OrganizationId | ItemName | timestamp | val |
|---|---|---|---|---|
| Site123 | Org123 | temp | 2021-11-10T00:00:00.000+0000 | 58.7 |
| Site123 | Org123 | pressure | 2021-11-10T00:00:00.000+0000 | 1023 |
| Site123 | Org123 | humidity | 2021-11-10T00:00:00.000+0000 | 63.29 |
| Site123 | Org123 | DewPoint | 2021-11-10T00:00:00.000+0000 | 46.3 |
| Site123 | Org123 | temp | 2021-11-10T01:00:00.000+0000 | 56.5 |
| Site123 | Org123 | pressure | 2021-11-10T01:00:00.000+0000 | 1023.1 |
| Site123 | Org123 | humidity | 2021-11-10T01:00:00.000+0000 | 69.11 |

Point Data stream from site (Bronze 1)

168

| hasTimeSeriesId | ItemName | Quality | Time |
|---|---|---|---|
| fdaa9319-caf1-4b4d-9bdf-faacbc2e8d56 | history$3a$2SfS2femaas_fc_qa$2fem1 | "{ok}" | 2021-10-01T06:00:00.018+0000 |
| fdaa9319-caf1-4b4d-9bdf-faacbc2e8d56 | history$3a$2SfS2femaas_fc_qa$2fem10 | "{ok}" | 2021-10-01T06:00:00.039+0000 |
| fdaa9319-caf1-4b4d-9bdf-faacbc2e8d56 | history$3a$2SfS2femaas_fc_qa$2fem11 | "{ok}" | 2021-10-01T06:00:00.041+0000 |
| fdaa9319-caf1-4b4d-9bdf-faacbc2e8d56 | history$3a$2SfS2femaas_fc_qa$2fem12 | "{ok}" | 2021-10-01T06:00:00.044+0000 |
| fdaa9319-caf1-4b4d-9bdf-faacbc2e8d56 | history$3a$2SfS2femaas_fc_qa$2fem13 | "{ok}" | 2021-10-01T06:00:00.046+0000 |
| fdaa9319-caf1-4b4d-9bdf-faacbc2e8d56 | history$3a$2SfS2femaas_fc_qa$2fem14 | "{ok}" | 2021-10-01T06:00:00.049+0000 |

- Need to identify corresponding weather information for each point in Bronze 1

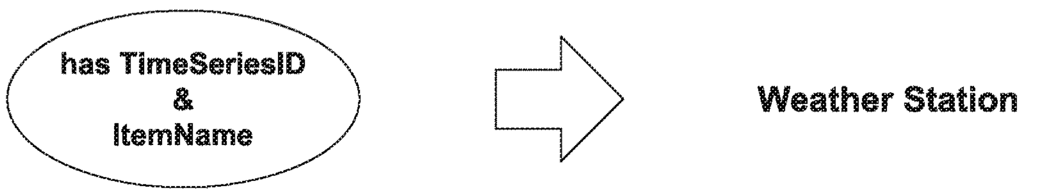

FIGURE 17

HOW TO GENERATE META DATA

Query to generate Meta Data traversing the rdf graph:

query = "[org]->a->honbrick:Organization;{org}->brick:hasPart->[site];{site}->brick:latitude->[latitude];{site}->brick:longtude->[longitude];{site}->honbrick:systemId->[systemid];{site}->brick:hasPart->[elecmeter];{elecmeter}->brick:hasPoint->[consumption];{consumption}->honbrick:pointId->[meterid]" 171

AUTOMATIC MACHINE LEARNING BASED PREDICTION OF BASELINE ENERGY CONSUMPTION

BACKGROUND

Buildings appear responsible for over forty percent of global final energy consumption and, as a result, nearly one-third of direct and indirect CO2 emissions. Ensuring buildings are sustainable and energy-efficient may be key to efforts to tackle climate change. Existing energy management solutions, methods or approaches do not necessarily offer ways to evaluate energy consumption patterns real-time.

Estimated energy consumption or baseline in a building may be an estimated/expected energy value that is to be consumed in the building under normal working conditions as per its set-up. Estimating energy consumption of a building may require extensive experience in building energy management. It may also require analysis of much data like historical energy consumption, weather, occupancy, building layout, and so on. Having a framework that would auto-generate the estimated energy consumption of any building may help avoid a large manual effort.

SUMMARY

The present solution, approach or method, may include an end-to-end automated data pipeline for data ingestion, storage, analysis, deployment, and ML model maintenance. The present solution, approach or method, which computes a baseline using machine learning methods, may help in the following ways. Accurate real time estimation may help evaluate the actual energy consumption, effectively identifying underlying root causes for an increase in actual consumption, as compared to the estimated energy, triangulating the time of day and place of such occurrences and correlating with dynamic factors like weather and occupancy. Accurately quantifying energy savings may be helpful. Forecasting energy consumption in the future, may enable planning for future energy needs. Energy saving calculations may be done by comparing actual consumption versus baseline predicted consumption based for a specific period. The present solution may offer a configurable machine learning model, which learns energy consumption patterns, i.e., a relationship between various factors and energy consumption for the desired baseline period and enables savings computation.

BRIEF DESCRIPTION OF THE DRAWING

FIG. 4 is a table of data about a site 1 in view of a set of independent variables under a model-XGB;

FIG. 6 is a table of data about a site 2 in view of a set of independent variables under a model-XGB;

FIG. 15 is a diagram of a "graphical representation" of a sample common data model;

FIG. 17 is a diagram of sample delta tables;

DESCRIPTION

Figure 1:
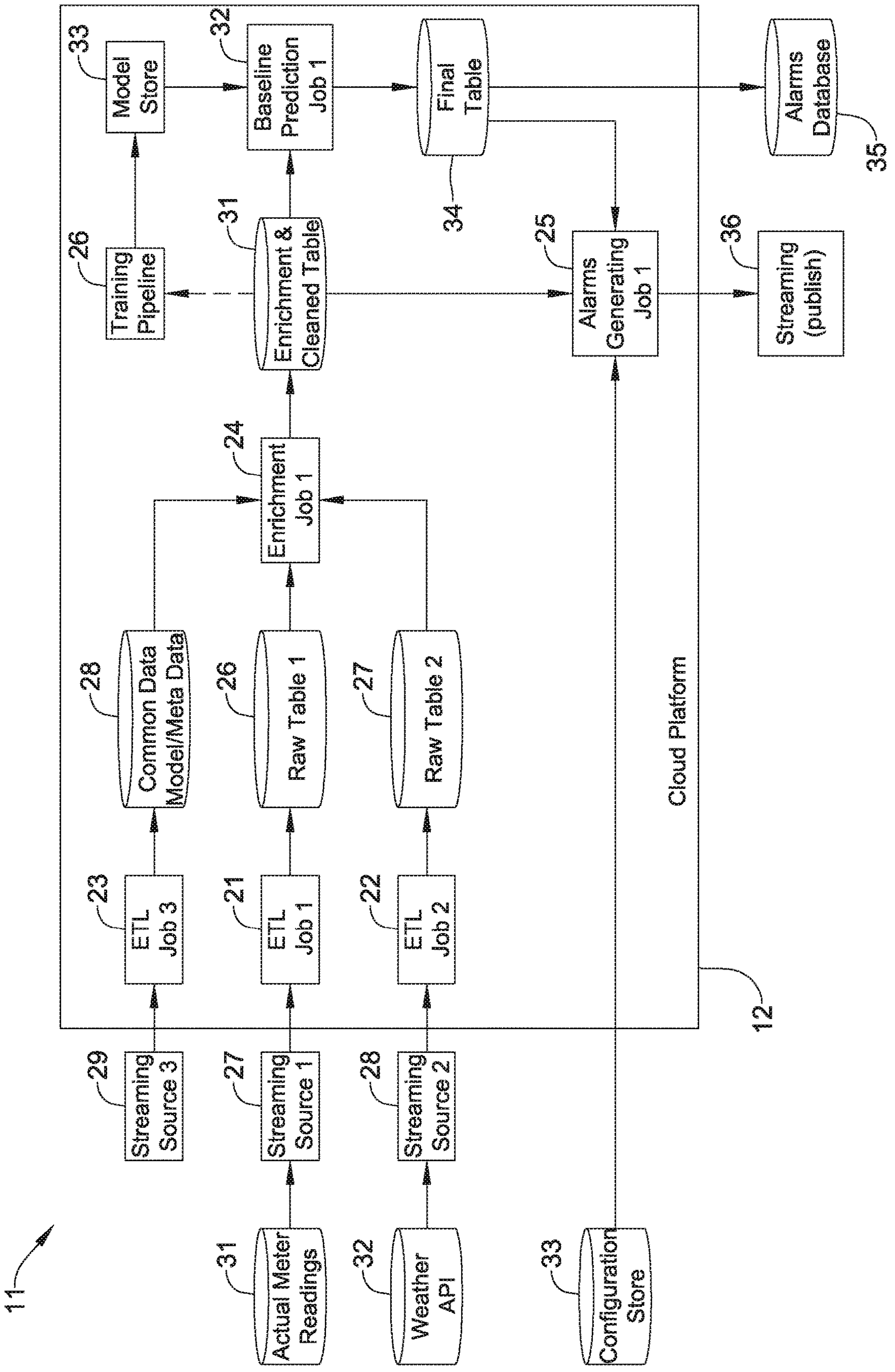
FIG. 1 is a diagram of an estimated energy prediction pipeline.

To generalize, the energy baseline of a building may be an estimated or expected energy usage by a building under normal working conditions as per its set-up. The present system may automate the energy baseline generation of any building using a machine learning (ML) model. The system may use historical energy consumption, weather, occupancy, building layout, and so on, to generate the baseline.

The system may include a generic or generalized energy baseline prediction model, which estimates a baseline even in the absence of historical energy consumption data from energy meters. This enables the model to function for new sites for which historical data do not exist. An agnostic model may work for both old and new buildings.

The system may have a site-specific prediction model. The system may also include site-specific models which learns both site-agnostic, an underlying relationship between energy consumption and weather patterns, occupant behavior, in addition to site-specific characteristics and geo location characteristics. This system may enable the model to function for old sites for which historical energy meter readings are absent.

Data quality checks and handling missing values may be done in ten second or less near real time. Complete data is important for the accurate baseline prediction. Missing or invalid data may reduce the accuracy of the model. Generally, in a machine learning model development, data quality improvement may be done manually. But the present system identifies missing, invalid data points from the incoming live stream of energy meter data, removes invalid data points and fills missing values using a combination of rule-based and statistical interpolation techniques. This data quality enrichment procedure runs in near real-time.

A digital twin of the building may be a digital representation of a physical asset. The system may employ a graph-based ontology (grammar) which serves as a digital twin representation of the building. The digital twin may capture characteristics of the building, relationships among various assets in the building like HVAC, pumps, and so on, their properties and operations in the building.

A separate digital twin instance of each of the buildings may be created using the generic ontology. The system may also maintain the historical changes in the building (like a new HVAC or addition of new lab space, and so forth) in the form of past versions of the digital twin. Such historical digital twin instances may be used for back testing baseline prediction models. This may give one an ability to compare new algorithms/models with previous algorithms/models and evaluate the effect of changed relationships on energy consumption in the building.

Auto retraining of an ML model may be noted. A baseline prediction ML model, which is the critical aspect of the system, may update itself on its own based on triggered events (e.g., new floor addition, building level changes, and so on). This approach may avoid manual intervention to retrain the ML model periodically. This may be enabled by a robust ML operating system (MLOps) pipeline to periodically train the underlying machine learning model on incremental data. MLOps may be a framework of software elements that helps in managing the code and deploy machine learning models throughout its lifecycle. The system has such a pipeline to manage the ML models.

Auto-alert generation and recommendation may be noted. The system may include automated generation of real time alerts when the energy consumption is higher than the baseline. The system may also have a recommendation module that highlights causes of the higher than normal/estimated energy consumption. It may also provide actionable insights that help a building management team to fix the faulty equipment that is causing high energy consumption.

The system may use real-time or live occupancy information as an external factor in the ML model. Realtime occupancy may be highly correlated with the energy consumption of the model. Thus, the present baseline prediction may be highly accurate.

The system may forecast estimated consumption in multiple forecast horizons (e.g., short term up to 7 days and long term up to 30 days) to facilitate planning ahead in time, for energy demand in the building.

The system may use specific ML algorithms that can capture non-linear and complex relationships between energy consumption and other parameters like building level, ontology features, weather conditions, occupancy, and so on, holistically. This may result in a highly accurate baseline prediction than the related art which generally uses algorithms that can capture only linear and non-complex relationships.

The following may reveal the advantages of the present solution, over other existing solutions: 1) Adaptability—A baseline estimation solution is adaptable and works for different types of buildings, different geolocations, different usage patterns, different occupancy, and so on; 2) Accuracy—Estimates are accurate, but not be overfit and thus generalized across buildings and the globe; 3) Continuous improvement—a self-learning model which improves on its own, after deployment, by learning continuously from new data over a period of time; 4) Scalability—Due to the above-mentioned need for maintaining model accuracy, adaptability across sites/geo-location and multiple types of meters, continuous improvement for multiple sites and meters is required in real time, which this disclosure provides 5) Robustness—it may work even in situations of unavailability of historical energy consumption data; and 6) Normalization—an ability to normalize energy consumption patterns over multiple building characteristics like occupancy, size, and geolocation. This may enable cross-buildings benchmarking.

The energy baselining approach or solution, part of a company's energy management as a Service offering for commercial buildings, may provide an ability to track actual consumption against an estimated consumption/baseline as per current operating conditions. This may provide an ability to compute and realize energy savings in the long run, and thereby reduce a carbon footprint. There may be an ability to identify a root cause of spikes in energy consumption as compared to expected consumption. There may be a further ability to calculate baseline consumption as per any baseline period. This approach may be used by energy managers and auditors to evaluate building energy conservation measures (ECM), compare different measures, and understand each ECM's efficacy. Additionally, this might be leveraged for energy savings calculation.

Near-term forecasting of energy consumption may result in an ability to benchmark each site against other sites, from an energy efficiency standpoint.

To reiterate, key aspects of the present solution that make it robust and unique may include the following.

1) Adaptability—The solution may collect data from multiple sites and different meters connected to different loads. With this wide distribution of sources of data, the machine learning algorithm may learn complex patterns in consumption. With a continuous learning feature in place, it may learn generalized patterns over long a period of time (needed for baselining) as well as immediate shift in a consumption pattern (needed for real time monitoring and alerting).
2) Accuracy—The machine learning algorithms may be designed to be robust to outliers using outlier detection algorithms and time series cross validation techniques. This may make sure that the patterns learned are robust and generic enough to be used, going forward in time, as well as for multiple sites, especially when there is no data available for new sites.
3) Improvement—The data pipeline may be designed for continuous training on new data. This feature may be scheduled based on time triggers, drift analysis and/or manual triggers. This may help keep the models up to date, continuously improve over time and learn a needed pattern as per the end use case.
4) Scalability—The present may be hosted entire on cloud and thus have an ability to scale up storage and compute resources. Running on distributed compute engines may give one an ability to process a large volume of data at a great velocity, real time. This may make onboarding new sites efficient and scalable, and give a central repository for all machine learning (ML) models which can be leveraged by new sites when there is no historical data.

Figure 2:
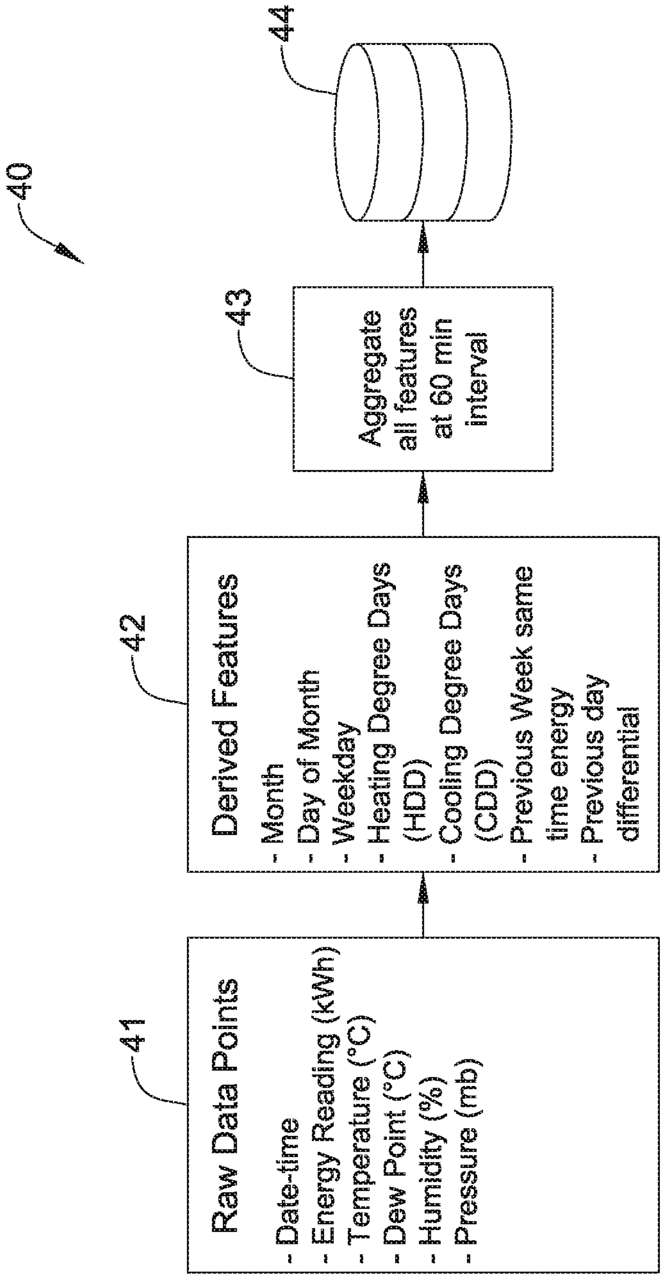
FIG. 2 is a flow diagram for a dataset preparation.

The present solution may include an end-to-end automated data pipeline for data ingestion, storage, analysis, deployment, and ML model maintenance. FIG. 1 shows a diagram 11 of an estimated energy prediction pipeline. FIG. 2 is a flow diagram 40 for dataset preparation.

Data quality of incoming data may be assured, through interpolation methods for missing/anomalous data, outlier treatment, data sanity checks and cleansing logic implementation. These items as indicated in FIGS. 2-6 are shown as an estimated energy prediction model.

The solution has a robust ontology definition, to model entire building's ontology in an rdf triples format, which may be updated via streams of change events to building ontology definitions. An ontology graph may be reviewed to extract information on relationships among various equipment, e.g., what load each meter is connected to, and so on. FIGS. 7-12 relate to a building ontology model.

One approach for the solution may be to use linear models to establish relationship between predictors like weather conditions, and load type with the energy consumption of a meter. However, the actual relationship between consumption and other factors may be stochastic in nature and highly non-linear, especially when we estimate at an hourly/15-minute frequency. Thus, a non-linear machine learning model, namely XGBoost regressor, which is an optimized implementation of gradient boosted decision trees, may have been used to get accurate predictions.

An energy consumption baseline may be estimated using learning from historical data and capturing multivariate, non-linear relationships among energy consumption and weather, occupancy, building size, type, layout, and so on.

Figure 14:
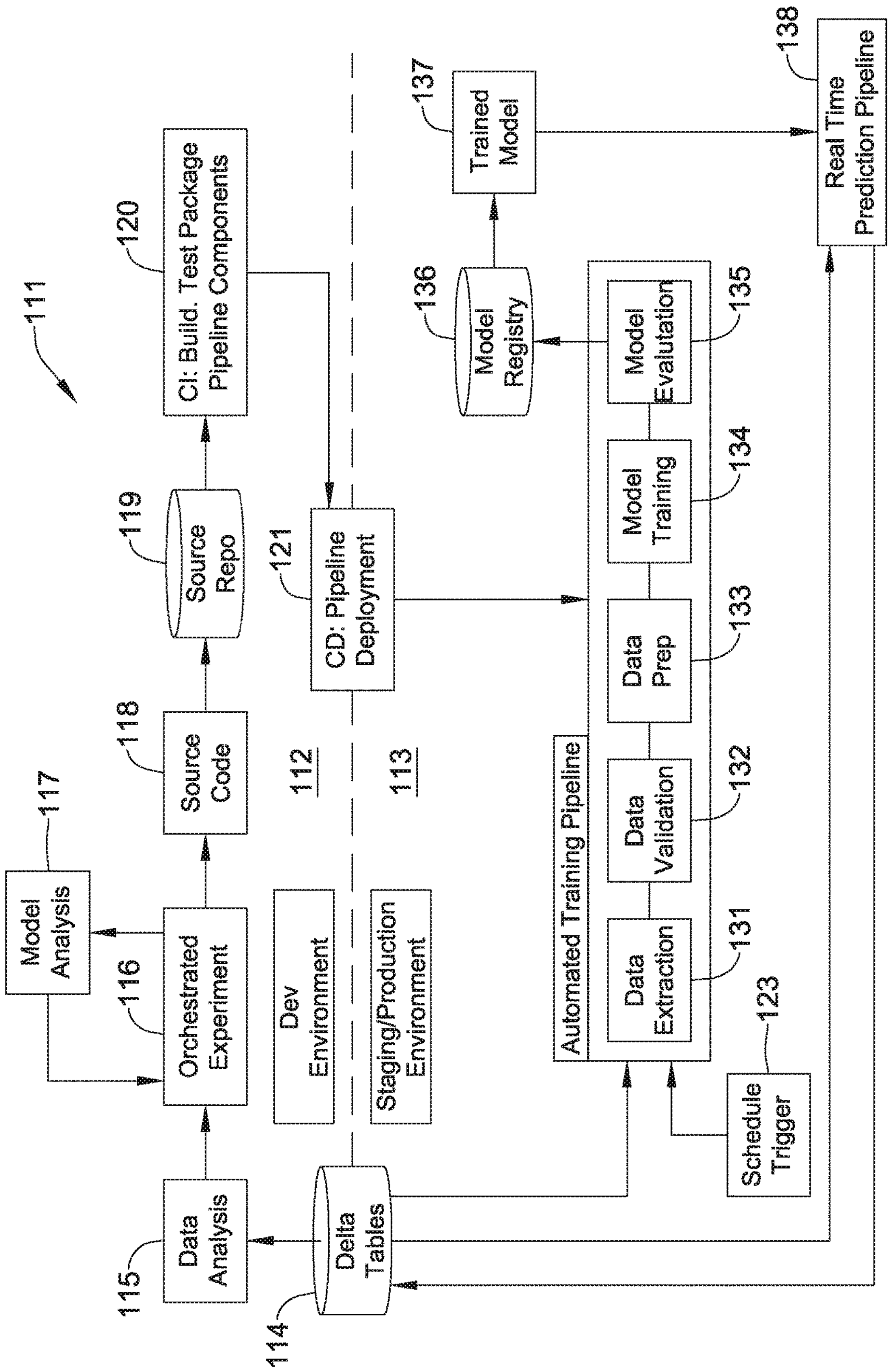
FIG. 14 is a diagram related to a pipeline approach.

MLOps strategies may have been adopted for an ML model maintenance in production, as per industry standard CRISP-DM. FIG. 14 is a diagram of MLOps.

The present approach may be a key component of building energy management solution. This may give an ability to estimate energy consumption, considering external weather parameters, occupancy, size of the building, load connected to various meters, and historical energy consumption patterns.

The predictions may be used to create real time alerting systems that are triggered when the actual consumption exceeds the baseline, beyond a preset threshold value. These alerts may help in diagnosing the unusual high energy consumption real time and be used to identify in a timely manner, faulty equipment, which may be consuming extremely high energy. FIG. 1 is a diagram that refers to energy baselining pipeline for the architecture and an estimated energy prediction pipeline.

As a result of identifying and diagnosing real-time spikes in energy consumption the solution may make it possible to realize savings in the long run.

Forecasts of energy consumption may help plan for energy needs in future. The solution may enable a comparison of multiple sites, from an energy consumption standpoint, track energy efficiency for each of them, giving the facility managers better decision-making ability to make the building more energy efficient.

The solution is integrated into the product in the following manner:

The solution may be integrated with a BMS Supervisor and is to be provided as a service.

Energy meter reading may be collected from underlying BMS systems, data stored on cloud, including a history of readings from different buildings.

Cross building analytics may be performed and the solution may estimate energy consumption even for new buildings/sites which do not have historical data for training machine learning models.

This may help in building a timely maintenance as the deviation from estimated energy consumption is key for determining anomalies.

Organizations may leverage collective intelligence gathered from multiple sites.

The solution may have a software component with a stack level: insight (analytics)—data manipulation to gain info (trend and predictive analytics tool)

There may be a software type: connected/connectivity—offering available thru cloud or direct, remote connection (SaaS) or cover infrastructure enabling connected services (Sentience).

There may be an IOT stack level: insight (analytics)—data manipulation to gain information (trend and predictive analytics tool).

The solution may generate or capture data. The type of data and where it will reside may be energy meter readings from sites that are collected. The data may be stored in a cloud storage. Also, there may be weather data collected from an external API and there may be building ontology data.

Job names, schedules and job purposes relative to diagram 11 of cloud platform in FIG. 1 may be noted. These items are illustrative examples. Symbol 21 represents ETL-job 1, symbol 22 represents ETL-job 2, and symbol 23 represents ETL-job 3. The schedule for job 1—is to run every 15 minutes, having a purpose to read data from a streaming source 1 and push to run data storage (delta table bronze 1). The schedule for job 2 is to run every 15 minutes, having a purpose to read data from streaming source 2 and push to raw data storage (delta table bronze 2). The schedule for job 3 is to run at a lesser frequency once a day/once every 12 hours, and so on, having a purpose to read data from streaming source 3 and push change events to a common data model store.

Symbol 24 represents enrichment job 1 having a schedule to run every hour and having a job purpose to calculate baseline consumption for every point (meter) at a 15 minute resolution. Symbol 25 represents an alarm generating job 1 having a schedule to run every 15 minutes, and having a purpose to read actual consumption (from an intermediate table), read baseline consumption from a final table, and read an alarm configuration from a configuration store, and generate an alarm publish to a streaming source. Symbol 26 may represent a training pipeline that has a schedule to be triggered every one-half month or a synchronously manually.

A closer look at platform 12 in FIG. 1 may be checked from left to right. A symbol 27 represents a streaming source 1 that has an output to symbol 21 of ETL job 1. Symbol 28 represents steaming source 2 that has an output to symbol 22 of ETL job 2. Symbol 29 represents streaming source 3 that has an output to symbol 23 of ETL job 3.

Symbol 31 represents actual meter reading storage with a 15 minute resolution, and having an output connected to symbol 27. Symbol 32 represents a weather API storage with a 15 minute resolution, and having an output connected to symbol 28. Symbol 33 represents a configuration store having an output connected to symbol 25.

An output from symbol 21 may go to a raw table 1 represented by symbol 26 which in turn has an output to symbol 24. An output from symbol 22 may go to a raw table 2 represented by symbol 27 which in turn has an output to symbol 24. An output from symbol 23 may go to a common data model/meta data storage represented by symbol 28.

An output from symbol 24 may go to an enriched and cleaned table 29 as represented by symbol 31. An output from symbol 31 may, as shown by a dashed line, go to symbol 26 for the training pipeline. An output from symbol 31 may go to a baseline prediction job 1 as represented by symbol 32. Another output from symbol 31 may go to symbol 25 of the alarms generating job 1.

An output from the training pipeline of symbol 26 may go to a model store represented by symbol 33. An output from symbol 33 may go to symbol 32. An output from symbol 32 may go to a final table represented by symbol 34. An output from symbol 34 may go to symbol 25 representing the alarms generating job 1. Another output from symbol 34 may go to a symbol 35 representing an alarms database. From symbol 25 representing alarms generating job 1 may be an output to a symbol 36 representing streaming (published) from platform 12.

An auto model for predicting baseline energy consumption may be noted.

Leveraging historical energy consumption data and additional temporal features may improve an existing energy baselining solutions. Accuracy improvement may be demonstrated due to following reasons. There may be an inclusion of non-linearity (XGBoost) into a baseline prediction model to capture non-linear relationships. There may be additional metric computation (RMSE ratings to balance accuracy and generation capability of the model (overfit versus underfit. There may be data cleansing that involves rule-based and statistical methods for missing value imputation.

FIG. 2 is a diagram of dataset preparation. One may have a raw data points block 41 with, for example, date-time, energy, reading (kWh), temperature C., dew point C., humidity (percent), pressure (mb), and so on. From block 41, one may go to a derived features block 42. Derived features may include, for example, month, data of month, weekday, heating degree days (HDD), cooling degree days (CDD), previous week same time energy, previous day differential, and so on. From block 42, one may go to aggregate block 43, which may aggregate all features at 60 minute intervals. From block 43, one may go to a storage 44 to hold the aggregations of features.

The variables used herein and their descriptions may be noted. A weather variable may incorporate external temperature readings in C., heating degree days=(65−temp) in F., cooling degree days=(temp−65) in F., humidity in percent, dew point temperature, and atmospheric pressure in millibars (mb).

Historical meter readings may incorporate previous week same time energy (calculated by taking an energy meter reading 7 days prior to the same time instant), and previous day differential (t−1 day's one week differential, calculated by taking the difference between previous day's same time energy meter reading and 8 day's prior same time energy.

A date time may incorporate month (an integer value as per month, ranging from 1 to 12), time of the day (an integer value as per the hour, ranging from 0 to 23), day of the week (an integer value assigned starting with (Monday) to 6 (Sunday)), and weekend (binary value, 0 for day of week=[0,4] and 1 for day of week [5,6].

Figure 3A:
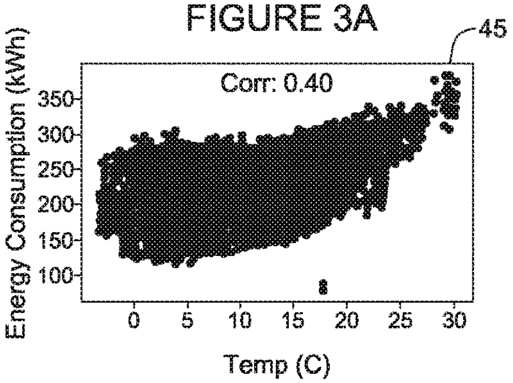
FIG. 3*a* is a graph of energy consumption versus temperature.
Figure 3B:
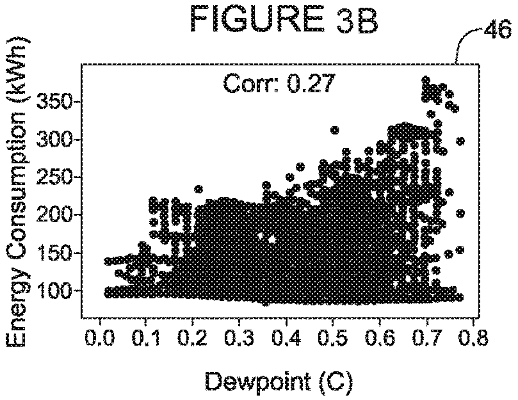
FIG. 3*b* is a graph of energy consumption versus dew point.
Figure 3C:
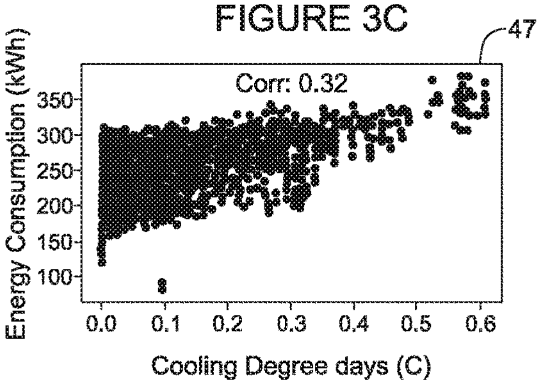
FIG. 3*c* is a diagram of energy consumption versus cooling degree days.
Figure 3D:
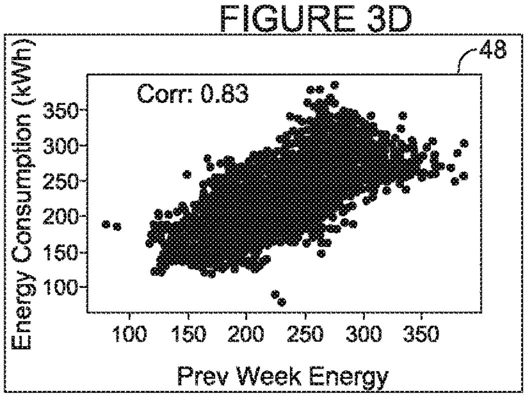
FIG. 3*d* is a diagram of energy consumption versus previous week energy.

FIGS. 3*a*, 3*b*, 3*c* and 3*d* show examples of energy trends versus independent variables. FIG. 3*a* is a graph 45 of energy consumption (kWh) versus temperature. FIG. 3*b* is a graph 46 of energy consumption (kWh) versus dew point. FIG. 3*c* is a diagram 47 of energy consumption (kWh) versus cooling degree days. FIG. 3*d* is a diagram 48 of energy consumption (kWh) versus previous week energy. Correlations (linear relationships) Corr:0.40, Corr:0.27, Corr:0.32, and Corr:0.83 are shown in diagrams 45, 46, 47 and 48, respectively. The linear relationship between energy meter readings and independent variables, temperature, and cooling degree days may be observed. Also, a strong linear relationship between the energy meter reading and the previous week same time energy consumption value as shown in graph 44.

FIG. 4 is a table 51 of data about a site 1 in view of a set 53 of independent variables under a model-XGB. Scores may be determined for co-efficient of determination (R2) which may be a measure of a percentage variance in a meter reading indicated by the model. The coefficient may be 0.68 for the model-XGB. Here, the higher the score, better is the model. A SMAPE score of 0.074 for the model-XGB may be determined. The lower the score, better is the model. A CvRMSE score for the model-XGB may be 0.11. The lower the score, better is the model. An RMSE score for the model-XGB may be 17.85. The lower the score, better is the model. An NMBE score for the model-XGB may be −0.0039. The lower the score, better is the model. An observation drawn here may be that the model performance increased considerably by including historical data and through the usage of non-linear methods to model the underlying relationship between energy consumption and the input variables.

Figure 5A:
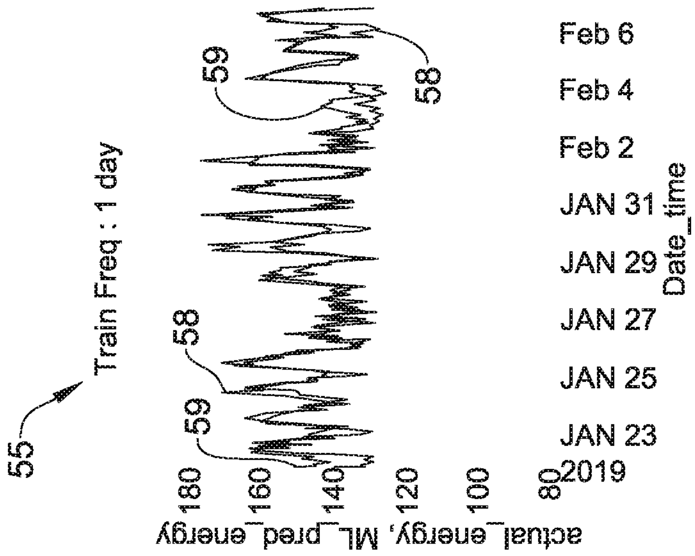
FIGS. 5*a*, 5*b* and 5*c* are diagrams for an ability to detect a shift in energy consumption patterns relative to the site 1.
Figure 5B:
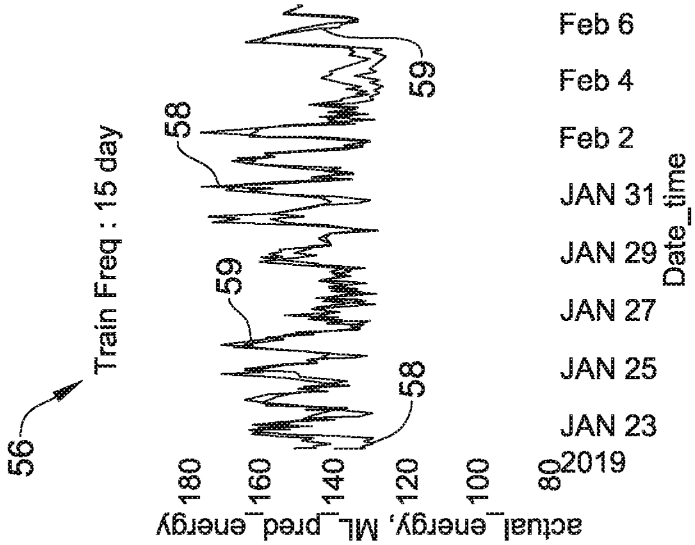
Figure 5C:
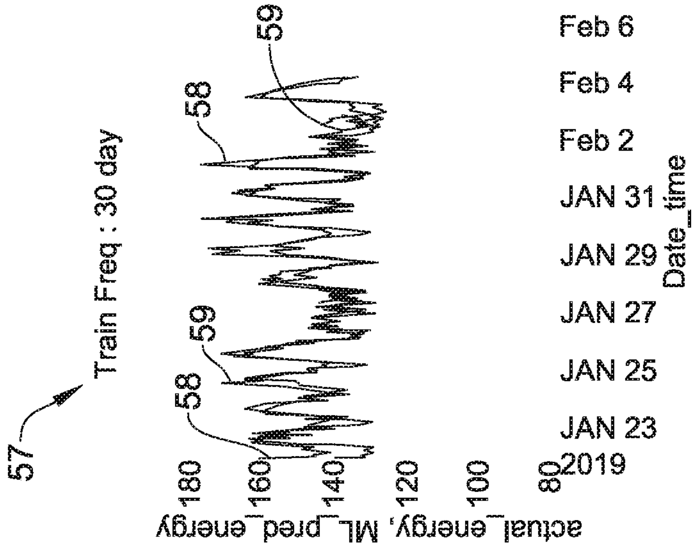

FIGS. 5*a*, 5*b* and 5*c* are diagrams 55, 56 and 57, respectively for an ability to detect a shift in energy consumption patterns relative to the site 1. Diagrams 55, 56 and 57 show actual_energy, ML_pred_energy versus date_time. Curve 58 represent actual energy and curves 59 represent ML_pred_energy in the diagrams. A variable in the diagrams is a train freq. of 1 day for diagram 55, a train freq. of 15 days for diagram 56, and a train freq. of 30 days for diagram 57.

Figure 7C:
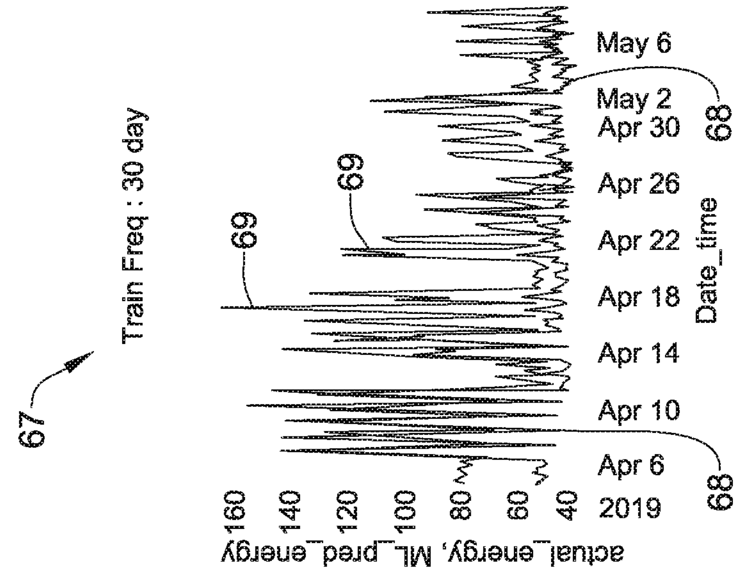
FIGS. 7*a*, 7*b* and 7*c* are diagrams for an ability to detect a shift in energy consumption patterns relative to the site 2.
Figure 7B:
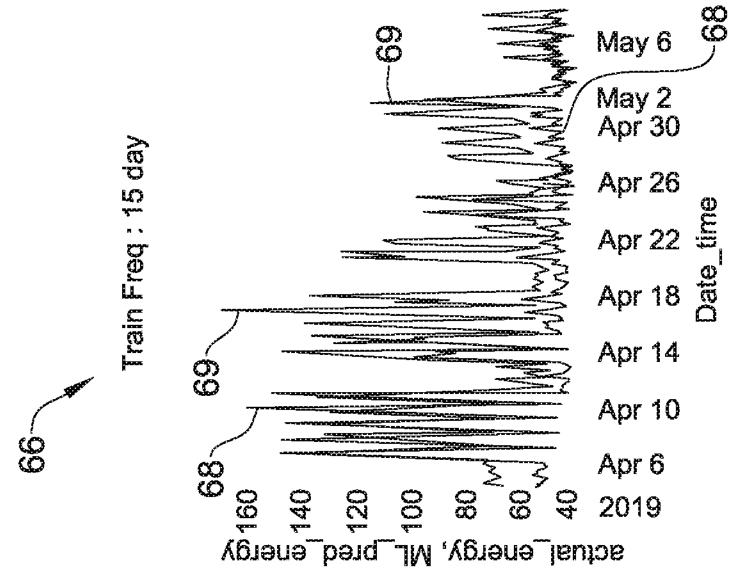
Figure 7A:
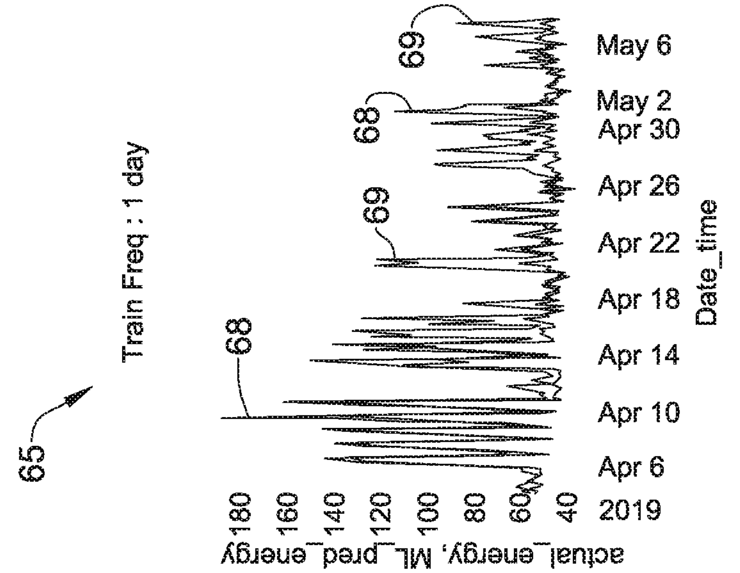

FIG. 6 is a table 61 of data about a site 2 in view of a set 63 of independent variables under a model-XGB. Scores may be determined for co-efficient of determination (R2) which may be a measure of a percentage variance in meter reading indicated by the model. The coefficient may be 0.55 for the model-XGB. Here, the higher the score, better is the model. A SMAPE score of 0.27 for the model-XGB may be determined. The lower the score, better is the model. A CvRMSE score for the model-XGB may be 0.40. The lower the score, better is the model. An RMSE score for the model may be 36.08. The lower the score, better is the model. An observation drawn here may be that the model performance increased considerably by including historical data and through the usage of non-linear methods to model the underlying relationship between energy consumption and the input variables. FIGS. 7*a*, 7*b* and 7*c* are diagrams 65, 66 and 67, respectively for an ability to detect a shift in energy consumption patterns relative to the site 2. Diagrams 65, 66 and 67 show actual_energy, ML_pred_energy versus date_time. Curves 68 represents actual energy and curves 69 represent ML_pred_energy in the diagrams. Variable amounts in the diagrams are a train freq. of 1 day for diagram 65, a train freq. of 15 days for diagram 66, and a train freq. of 30 days for diagram 67.

There may be further steps on auto-baselining as in the following: 1) Deciding on the frequency of re-training and training size on model performance during pilot deployment; 2) Testing the model on various geo locations; 3) Incorporating new features (e.g., occupancy, size of a subject building) in the model; 4) Exploring a possibility of a generic model that can predict a baseline when there are no historical data for the new meter and/or site; 5) Exploring how to incorporate dynamic changes to working conditions (e.g., an addition of a new lab); and 6) Identifying equipment which causes spikes in energy consumption and figuring out a cause. One would need an equipment's normal operating characteristics.

Figure 8:
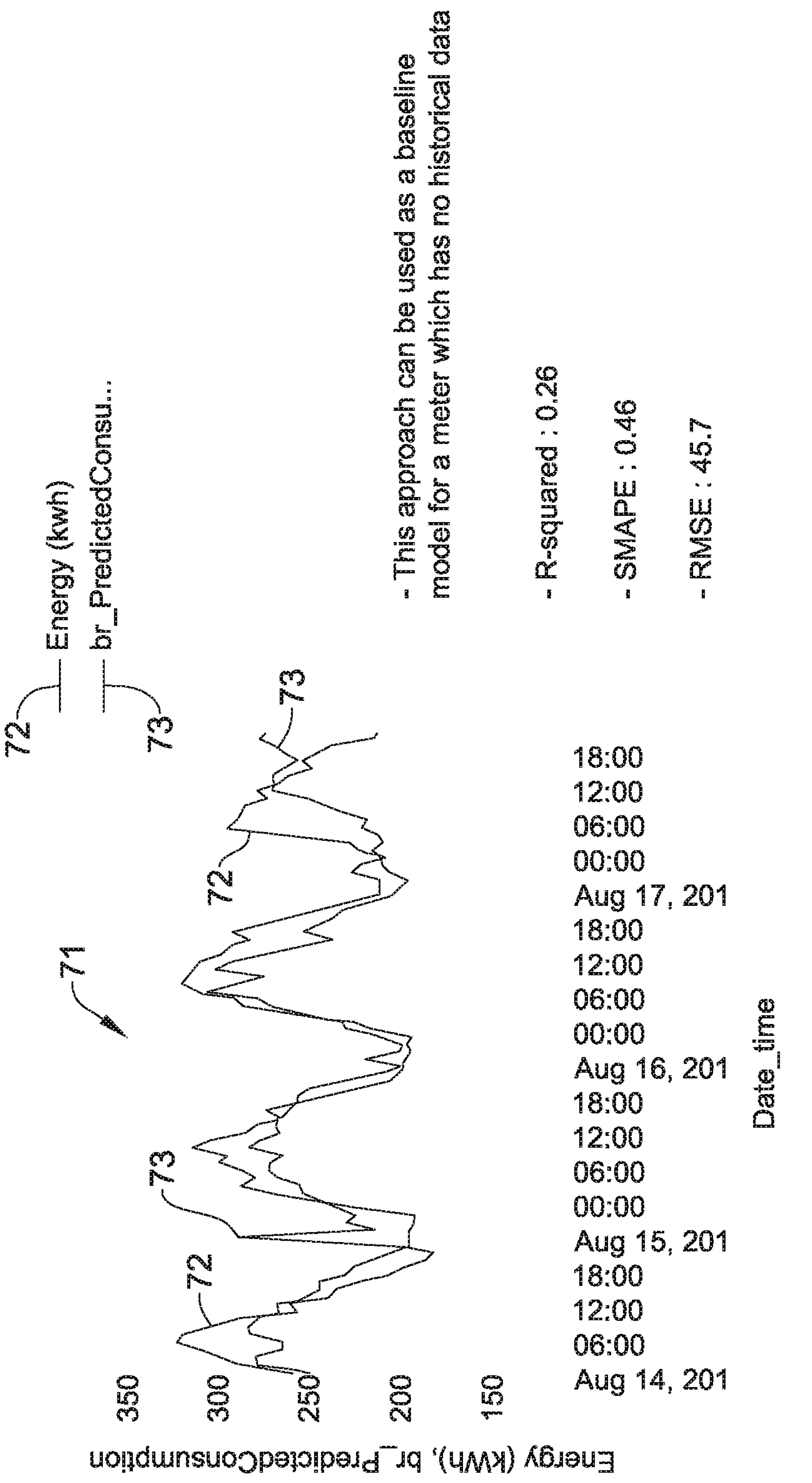
FIG. 8 is a diagram that assists in a generalizability of a baseline model.

FIG. 8 is a diagram 71 that assists in a generalizability of a baseline model. Diagram 71 is a graph of energy (kWh), predicted consumption versus time. Curve 72 reveals the energy (kWh) and curve 73 represents predicted consumption. One may train a model on the site 1 meter data. One may use this model to predict baseline predictions for the site 2 meter. The model has not necessarily seen data from the site 2 meters. The present approach may be used as a baseline model for a meter which has no historical data. R-squared may be about 0.26, SMAPE may be 0.46 and RMSE may be 45.7.

FIGS. 9-13 illustrate data cleansing by interpolating missing data in an energy stream. The logic of rule-based interpolation may be tested on manually simulated scenarious. Rule-based interpolation may be resorted on. Case 1 of FIG. 9 may have a gap L=3 hrs and a previous valid value==next valid value. Within rows 81, there may be a value @ 13:00==Value @ 17:00==9->fill all values in gap with a 9.

Figure 9:
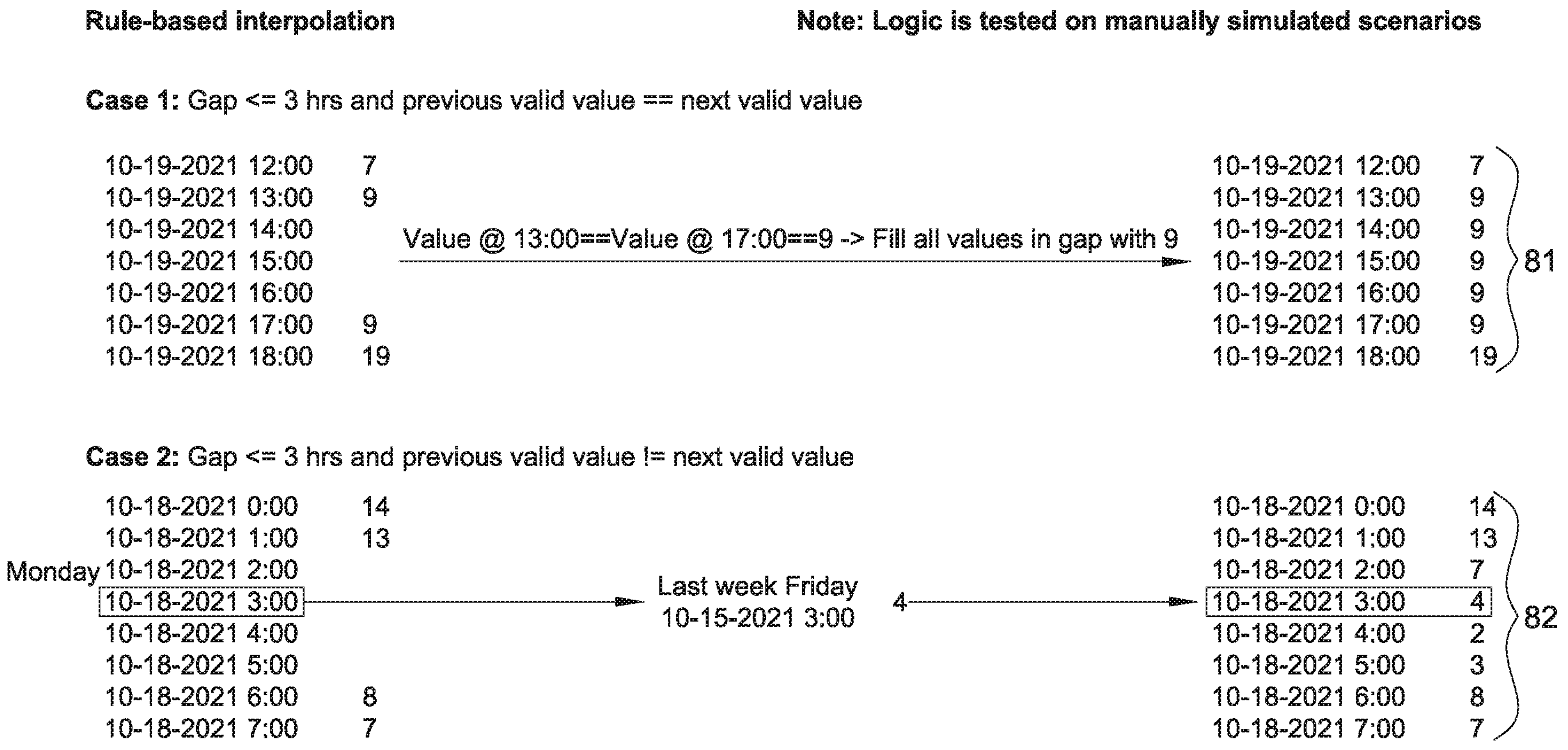
FIGS. 9, 10, 11, 12 and 13 illustrate data cleansing by interpolating missing data in an energy stream.

Case 2 of FIG. 9 may have a gap<=3 hrs and previous valid value=next valid value as noted in rows 82. A transition from last week Friday to Monday have values filled in gap with 4.

Figure 10:
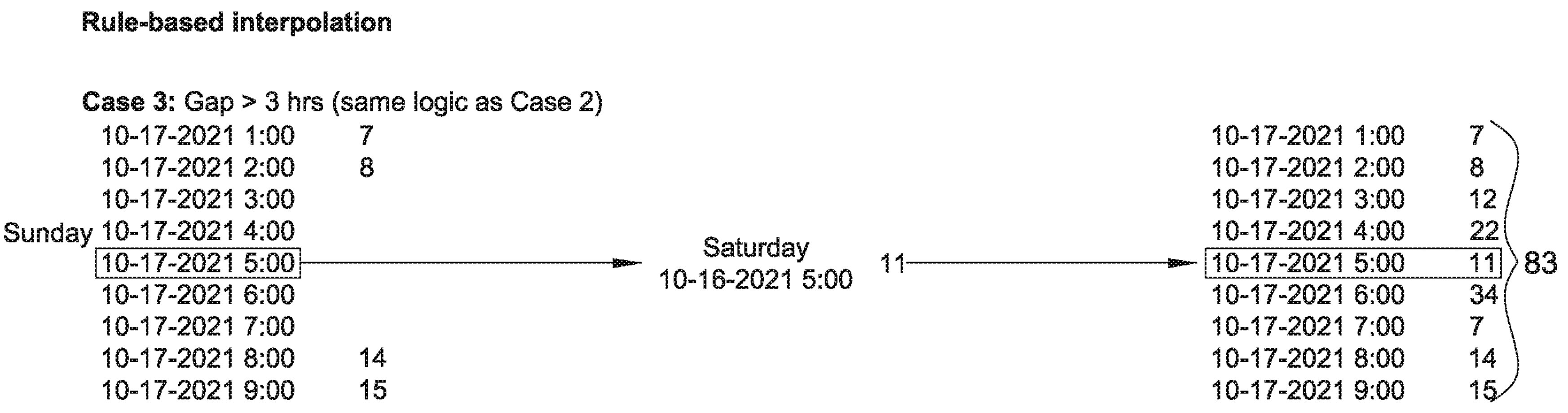

Case 3 of FIG. 10 may have a gap>3 hours using the same logic as case 2. A transition may be from Saturday to Sunday with values filled in gap with 11, in rows 83.

Figure 11:
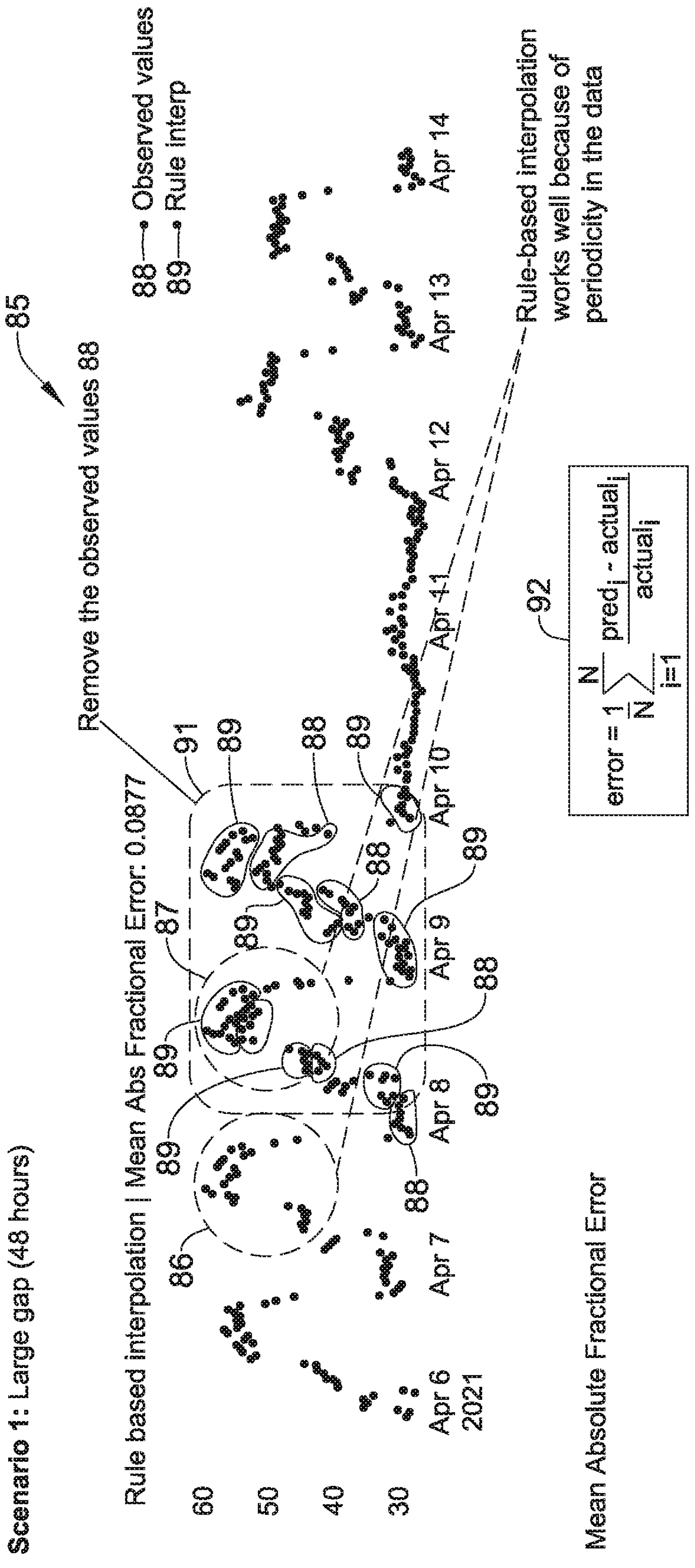

FIG. 11 is a diagram 85 that illustrates a scenario 1 having a large gap (e.g., 48 hours). There may be a rule based interpolation with a mean absolute fractional error of, for example, 0.0872. Diagram 85 shows values versus time and date. Rule-based interpolation works well because of periodicity in the data as indicated by slashed circles 86 and 87. Dots 88 and 89 may indicate observed values and rule interp values, respectively. Certain values 88 observed within square 91, for example, may be removed. The mean absolute fractional error may be indicated by a formula in a box 92.

Figure 12:
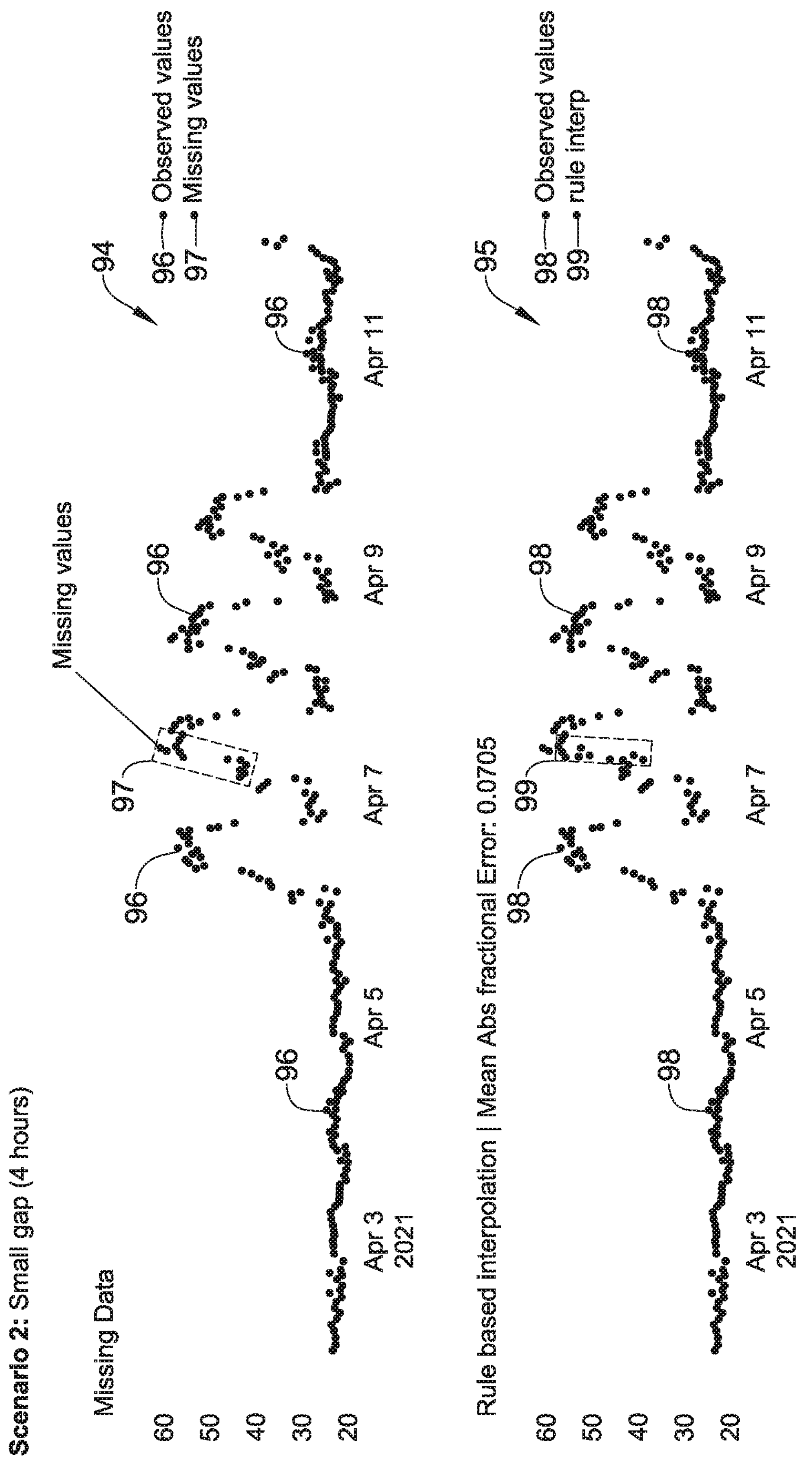

FIG. 12 reveals diagrams 94 and 95 of value versus time and date for a scenario 2 with a small gap (e.g., 4 hours). Diagram 94 reveals observed values 96 over time and missing values 97 over time. Graph 95 reveals observed values 98 over time. Also shown are rule interp values 99. Rule based interpolation of values 99 may have a mean abs fractional error of 0.0705.

Figure 13:
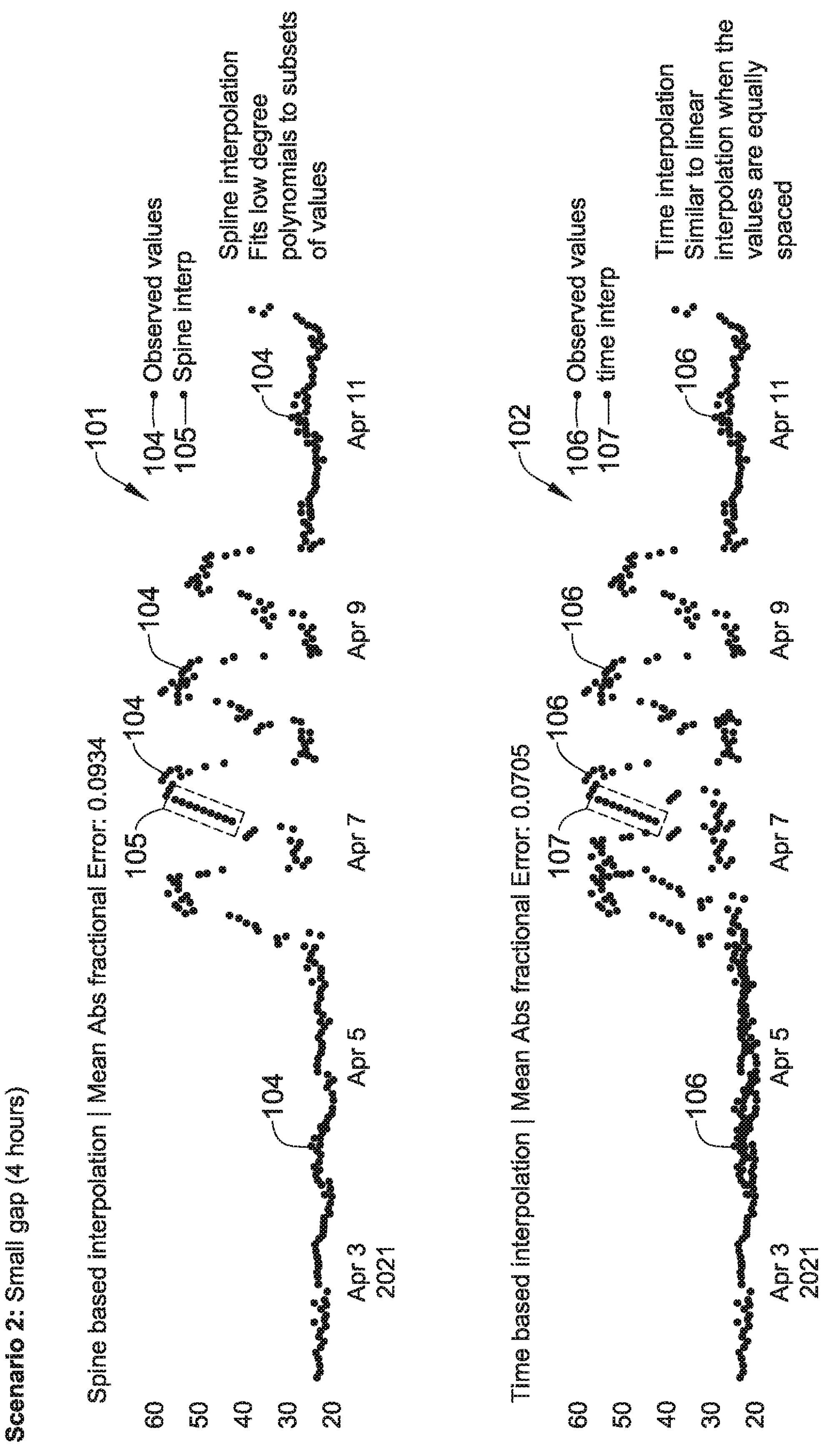

FIG. 13 shows diagrams 101 and 102 of data versus time and date. Observed values 104 and spine interp values 105 may be noted in diagram 101. Spline interpolation may fit low degree polynomials to subsets of values. Spline based interpolations may have a mean absolute fractional error 0.0834.

Observed values 106 and time interp values 107 may be noted in diagram 102. Time interpolation may be similar to linear interpolation when the values are equally spaced. Time based interpolation may have a mean absolute fractional error of 0.0705.

Standard interpolation techniques may be a good alternative for short gaps, but may not necessarily be applied for long continuous gaps (e.g., >10-12 hours). A rule based approach may be good at filling both short and long gaps provided that the underlying pattern is a repeating/periodic one as it is in the present cases.

FIG. 14 is a diagram 111 related to a pipeline approach. There may be a development environment 112 and a staging/production environment 113. A storage device 114 may be proportioned among development environment 112 and staging/production environment 113. An output from a feature storage device 114 may go to a data analysis component 115.

An output from component 115 may go to an orchestrated experiment setup 116. A loop with an output from setup 116 may go to a model analysis device 117. An output from device 117 may go to setup 116. A source code component 118 may receive an input from setup 116. An output from component 118 may go to a source repo storage device 119. A C1:Build, test package pipeline components 120 may have an output to a CD:pipeline deployment device 121 input in the development environment 112 that may have an output to an automated training pipeline 122. An output from storage device 114 may go to pipeline 122. Also, a schedule trigger device 123 may be connected to pipeline 122. Pipeline 122 may provide, in a stated order, data extraction 131, data validation 132, data preparation 133, model training 134, and model evaluation 135. An output of the model evaluation 135 may go to a model registry 136. An output of registry 136 may be a trained model 137. The trained model 137 may go to a real time prediction pipeline 138. A pipeline 138 output may go to data tables (feature store) device 119, which in turn may have an output connected to pipeline 138.

Common data model use and meta data of buildings for analytics may be noted. Building ontology information from multiple sites in a graph rdf may be stored. It may provide a way to query the model to extract any required ontology information about sites. Analytics may give way to create a separate view for the meta data without exposing the underlying data model.

FIG. 15 is a diagram 140 of a "graphical representation" of a sample common data model. A site 141 may have an ontology:latitude symbol 142 of a value of 51.50 and have an ontology:logitude value of −0.75398 at symbol 147. There may be a "ontology:systemid" connection to a symbol 143 indicating "fdaa9319-caf1-4b4d-9bdf-faacbc2e8d56". There may be a "ontology:hasPart" connection from symbol 141 to a symbol 144 indicating "Brick:elecMeter". A connection "a" from symbol 144 to a symbol 145 indicating "ontology:ElectricalMeter" may be made. There may be a connection "ontology:hasPointID" from symbol 144 to a symbol 146 indicating "history$3a$2f$2Femass_fe_qa$2fem1".

Information of graph representation 140 (viz., RDF triples) may be stored in delta tables 150. There may be seven rows for seven items. Five columns to indicate insert-time, contextID, subject, predicate, and object.

Figure 16:
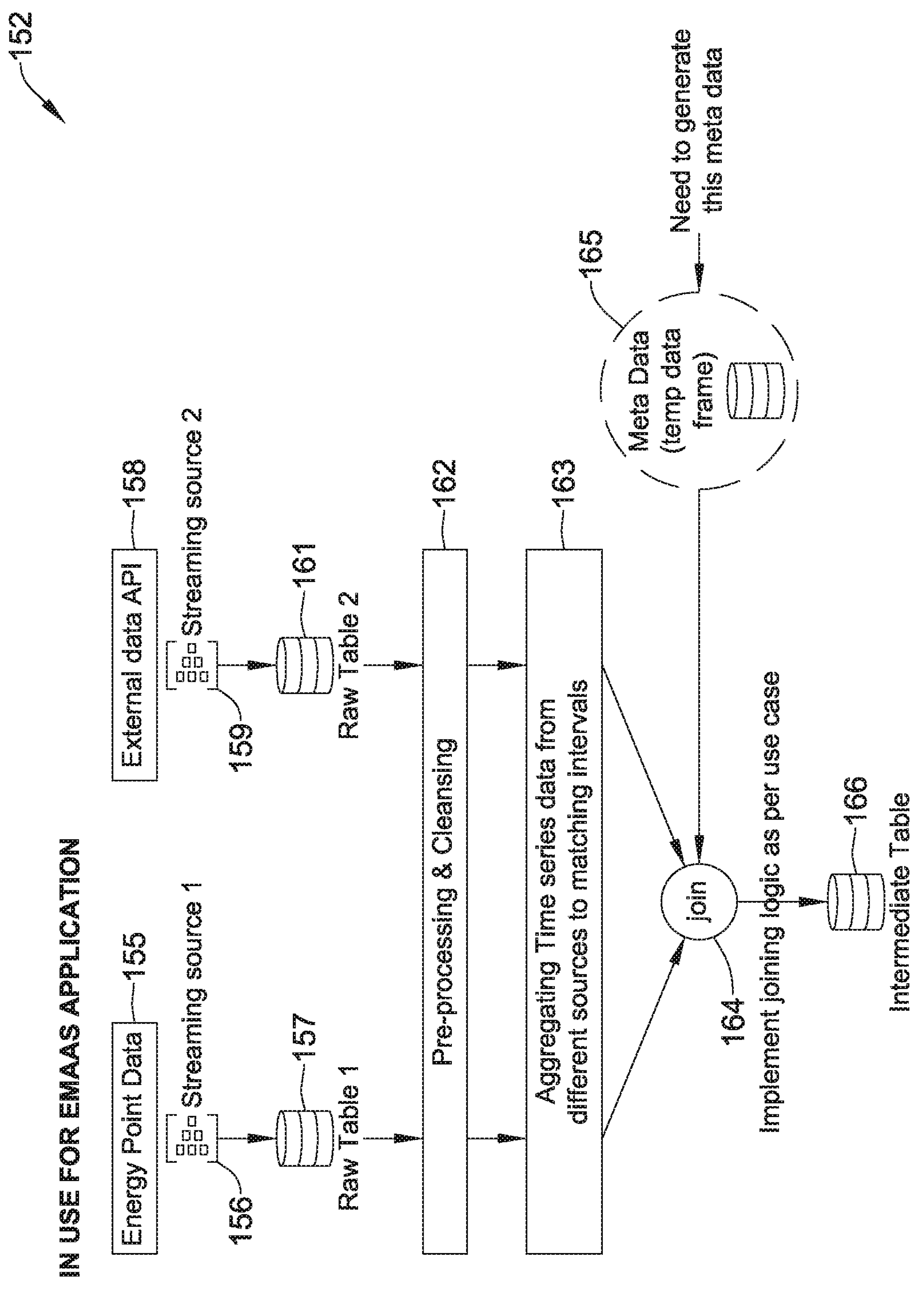
FIG. 16 is a diagram for an energy management as a service application.

FIG. 16 is a diagram 152 for an energy management application. Symbol 155 may represent energy point data. Item 156 may be a streaming source 1 with an output to a raw table 1 as indicated by a symbol 157. Symbol 158 may represent external data API. Item 159 may be a streaming source 2 with an output to a raw table 2 as indicated by a symbol 161. Outputs from table 157 and table 161 may go to a preprocessing and cleaning module 162. Output from module 162 may go to a module 163 for aggregating time series data from different sources to matching intervals. Outputs from module 163 may go to a join junction 164. Also, an output from a meta data (temp data frame) module 165 may go to join junction module 164. Meta data of module 165 should be generated. The joining may be implemented as per use case. An output from junction 164 may go to an intermediate table 166. There may be a matching of point data with weather.

FIG. 17 is a diagram of sample delta tables 168 and 169. Table 168 may have a point data stream from a site (bronze 1). Table 169 may have a weather data stream from weather API (bronze 2). One should identify corresponding weather information for each point in bronze 1. The information should have a time series ID and an item name. Three other columns for table 168 may be quality, time and value. Columns for table 169 may include Facility ID, organization ID, item name, time stamp and value.

Figure 18:
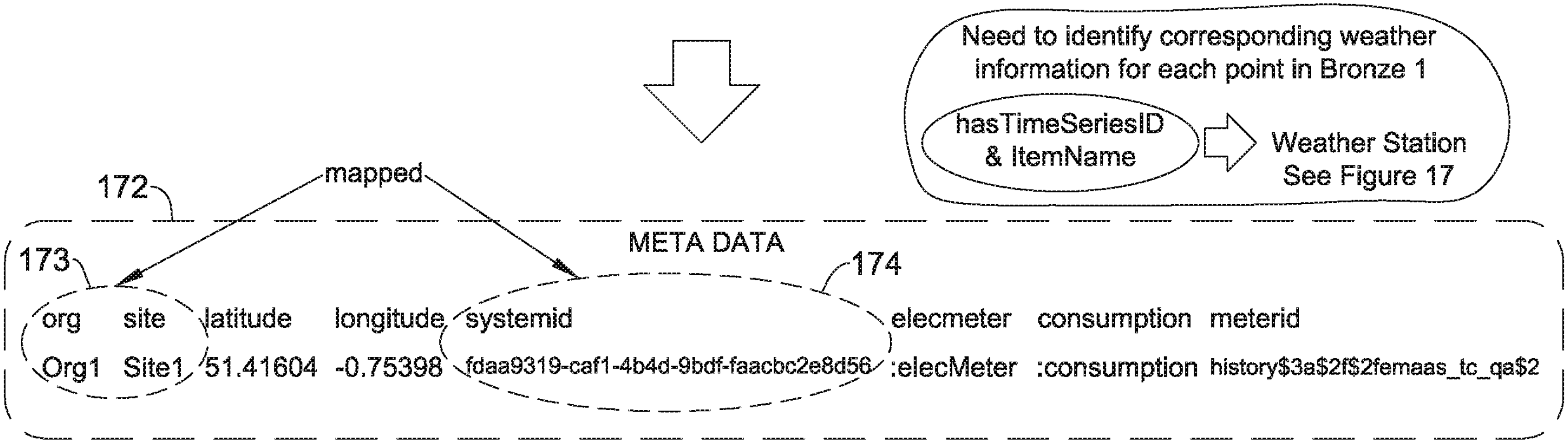
FIG. 18 reveals a query for generating meta data traversing an rdf graph.

FIG. 18 reveals a query 171 for generating meta data traversing an rdf graph. From query 171, meta data 172 may be generated. The meta data items may be mapped according to org and site as indicated at enclosure 173 and according to system ID at enclosure 174.

Figure 19:
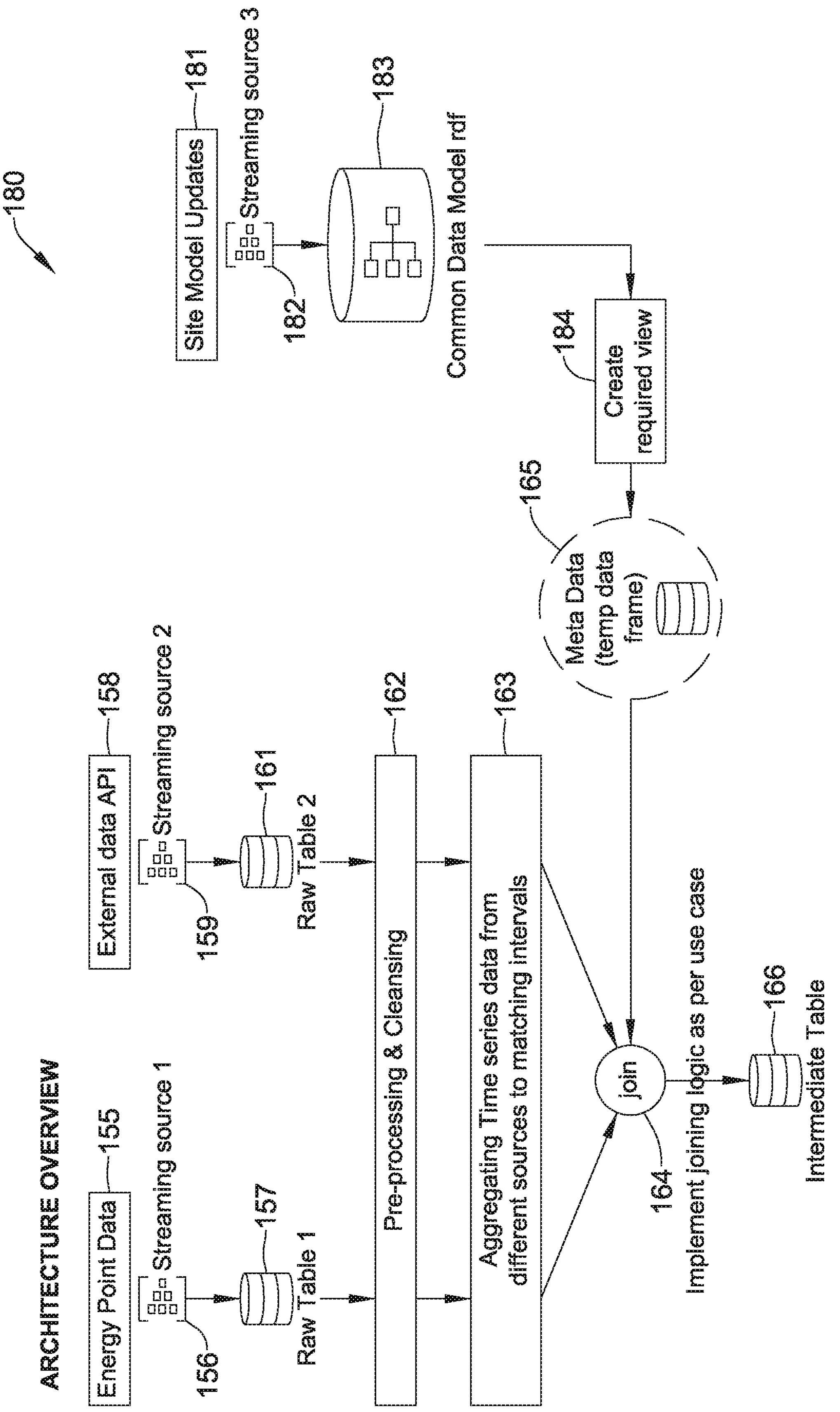
FIG. 19 is a diagram of an architecture overview.

FIG. 19 is a diagram 180 of an architecture overview. Diagram 180 is an expanded version of diagram 152 in FIG. 16. Site model updates may be represented by symbol 181. Streaming source 3 may be represented by a symbol 182. An output from streaming source 3 may provide streaming updates and changes to a "common data model rdf" from the sites. Symbol 183 may represent the common data model rdf. An output from the common data model may go to a module 184 to create a required view. An output of module 184 may go to module 165.

To recap, a mechanism for establishing and maintaining baseline energy consumption for a building, may incorporate a generalized energy consumption baseline prediction model, a—specific model of a building which learns site-specific relationship among energy consumption, weather patterns, occupant behavior, site structural characteristics and geo-location characteristics of the building, a framework that enables a machine learning model to retrain with updates, triggered events, and building changes, and a digital twin of the building which is a digital representation of the building that captures characteristics of the building, and relationship and change among various assets in the building. Energy consumption may be automatically compared with the generalized energy baseline prediction model.

The near real-time data quality enrichment procedure may identify missing or invalid data points from the incoming live stream of energy meter data, remove invalid data points and fill-in missing values using a combination of rule-based and statistical interpolation techniques.

Operational instances of the digital twin of the building may be used for back testing the generalized energy baseline prediction model, to give an ability to compare new algorithms or models with previous ones and evaluate the effect of changed relationships on energy consumption by the building.

A machine learning model may automatically update or retrain itself on its own, based on the triggered events with a machine learning operating system pipeline to periodically train the underlying machine learning model on incremental data, where the pipeline is a framework of software elements that manages a code and deploys the machine learning model throughout its lifecycle.

The machine learning model may incorporate algorithms that can capture non-linear and complex relationships between energy consumption and energy related parameters.

The mechanism may further incorporate automated generation of real time alerts when the energy consumption is higher than a baseline.

The mechanism may further incorporate a recommendation module that highlights causes of an energy consumption of the building higher than the baseline.

An energy consumption monitoring system may incorporate a first module configured to provide a generalized energy consumption baseline of a physical asset, a second module configured to measure energy consumption of the physical asset, and a third module configured to compare the energy consumption measured from the physical asset with the generalized energy consumption baseline of the physical asset. If the energy consumption measured exceeds the generalized energy consumption baseline, then an alert may emanate.

To provide the generalized energy consumption baseline of the physical asset may be automated using a machine learning model.

The generalized energy consumption baseline may be estimated in the absence of historical energy consumption data from energy meters of the physical asset, data of weather, occupancy, and building layout of the physical asset.

The physical asset may incorporate one or more buildings or structures.

The system may further incorporate a data quality enrichment procedure connected to the first module and run in a ten second or less near real time or real-time, and identify missing data points and invalid data points from an incoming live stream of energy meter data to the first module, remove the invalid data points, and fill-in missing values using a combination of rule-based and statistical interpolation techniques.

The system may further incorporate a digital twin of the physical asset. The digital twin may be a digital representation of the physical asset.

The digital twin may capture characteristics of the physical asset, relationships among various assets in the building like an HVAC and its properties, and operations in the physical asset.

An approach for evaluating energy consumption by a building, may incorporate generating an energy consumption baseline of a building, measuring energy consumption of the building, and comparing a measurement of the energy consumption of the building with the energy consumption baseline. If the measurement of the energy consumption exceeds the energy consumption baseline, then an alert may be issued.

An issued alert may be automatic.

Upon detecting the automatic issued alert on an indicator, highlighting on the indicator may occur to show actionable insights that help a building management team fix faulty equipment that causes the measurement of the energy consumption to exceed the energy consumption baseline.

The generating an energy consumption baseline of the building may be automated using a machine learning model.

Use of real-time or live occupancy information may be an external factor in the machine learning model. Real-time or live occupancy may be correlated with the energy consumption of the machine learning model.

Generating an energy consumption baseline of the building may be facilitated by an estimated predicted consumption in multiple forecast horizons varying from one day to sixty days to aid in planning for energy demand in the building.

In the present specification, some of the matter may be of a hypothetical or prophetic nature although stated in another manner or tense.

Although the present system and/or approach has been described with respect to at least one illustrative example, many variations and modifications will become apparent to those skilled in the art upon reading the specification. It is therefore the intention that the appended claims be interpreted as broadly as possible in view of the related art to include all such variations and modifications.

What is claimed is:

1. A method for evaluating energy consumption by a building, comprising:

generating an energy consumption baseline of a building using a machine learning model;

measuring energy consumption of the building;

comparing a measurement of the energy consumption of the building with the energy consumption baseline;

wherein if the measurement of the energy consumption exceeds the energy consumption baseline, then an alert is issued; and retraining the machine learning model with updates, triggered events, and building changes to the building; and wherein generating an energy consumption baseline of the building is facilitated by an estimated predicted consumption in multiple forecast horizons varying from one day to sixty days to aid in planning for energy demand in the building.

2. The method of claim 1, wherein an issued alert is automatic.

3. The method of claim 2, wherein, upon detecting the automatic issued alert on an indicator, highlighting on the indicator occurs to show actionable insights that help a building management team fix faulty equipment that causes the measurement of the energy consumption to exceed the energy consumption baseline.

4. The method of claim 1, wherein:

use of real-time or live occupancy information is an external factor in the machine learning model; and real-time or live occupancy is correlated with the energy consumption of the machine learning model.

* * * * *